(12) United States Patent
deVilliers et al.

(10) Patent No.: US 9,673,050 B2
(45) Date of Patent: Jun. 6, 2017

(54) METHOD OF PATTERNING INCORPORATING OVERLAY ERROR PROTECTION

(71) Applicant: Tokyo Electron Limited, Minato-ku, Tokyo (JP)

(72) Inventors: Anton J. deVilliers, Clifton Park, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/863,991

(22) Filed: Sep. 24, 2015

(65) Prior Publication Data

US 2016/0133464 A1    May 12, 2016

Related U.S. Application Data

(60) Provisional application No. 62/076,476, filed on Nov. 6, 2014, provisional application No. 62/150,759, filed on Apr. 21, 2015.

(51) Int. Cl.
*H01L 21/311* (2006.01)
*H01L 21/033* (2006.01)

(52) U.S. Cl.
CPC ...... *H01L 21/0338* (2013.01); *H01L 21/0337* (2013.01)

(58) Field of Classification Search
CPC ............. H01L 21/0335; H01L 21/0338; H01L 21/0332
USPC ............................................ 216/46; 438/696
See application file for complete search history.

(56) References Cited

U.S. PATENT DOCUMENTS

| | | | |
|---|---|---|---|
| 8,969,214 B2 * | 3/2015 | Light | H01L 21/0337 216/46 |
| 2011/0318931 A1 | 12/2011 | Min et al. | |
| 2012/0256309 A1 | 10/2012 | Tran et al. | |
| 2013/0157461 A1 | 6/2013 | Kim | |
| 2014/0273468 A1 | 9/2014 | Huang et al. | |

FOREIGN PATENT DOCUMENTS

KR    10-2012-0054348    5/2012

OTHER PUBLICATIONS

International Patent Application No. PCT1US20151052233, "International Search Report and Written Opinion," mailed Jan. 13, 2016, International Filing Date Sep. 25, 2015.

* cited by examiner

*Primary Examiner* — Roberts Culbert

(57) ABSTRACT

Techniques herein include use of a spacer processes for patterning flows during microfabrication for creating hardmasks, features, contact openings, etc. Techniques herein include using a sidewall spacer to define a hard border between features to be patterned. Such a spacer is positioned underneath an overlying relief pattern so that a portion of the spacer is exposed and protecting an underlying layer. Techniques herein can be used for metallization, and, in particular, metallization of a first metal layer above electronic device contacts. More broadly, techniques herein can be used for any type of critical placement where one structure is extremely close to another structure, such as with sub-resolution dimensions.

18 Claims, 11 Drawing Sheets

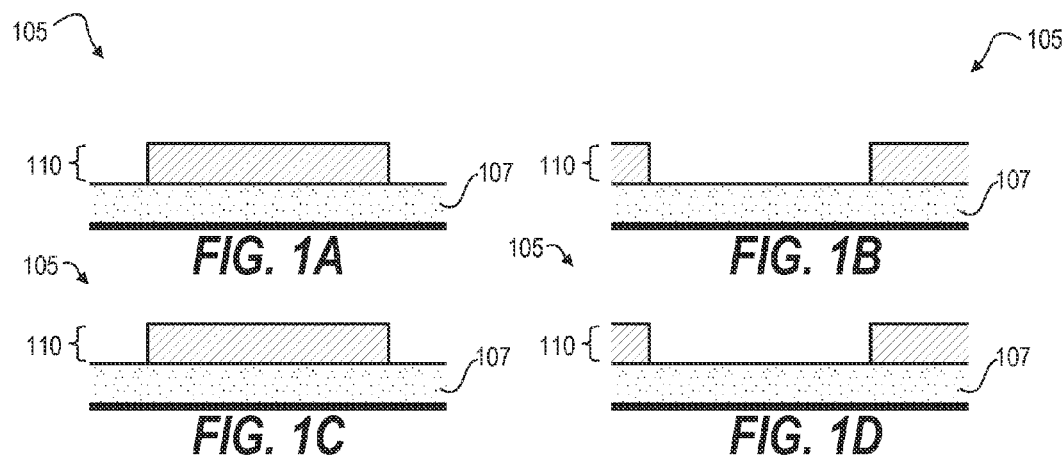
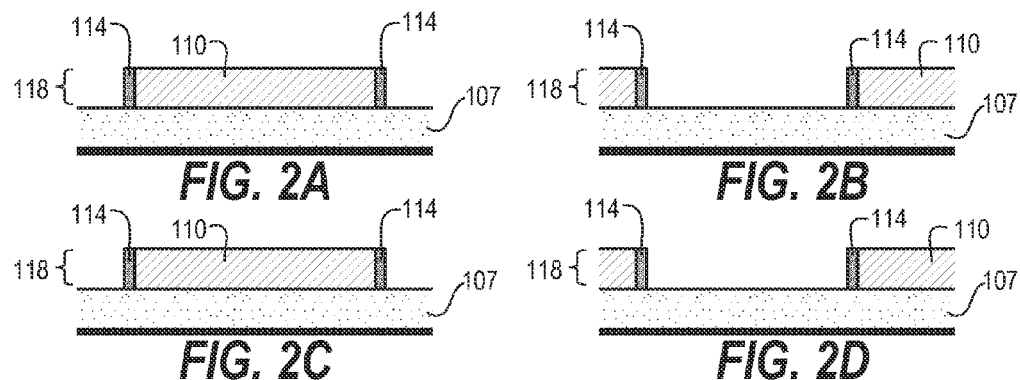
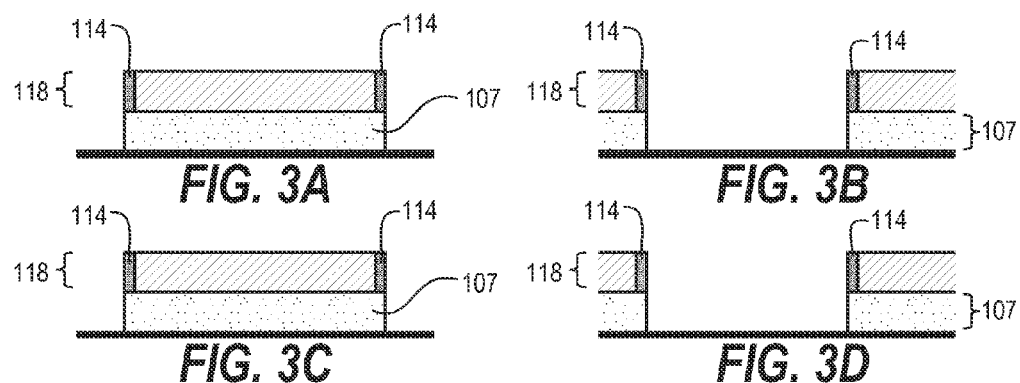

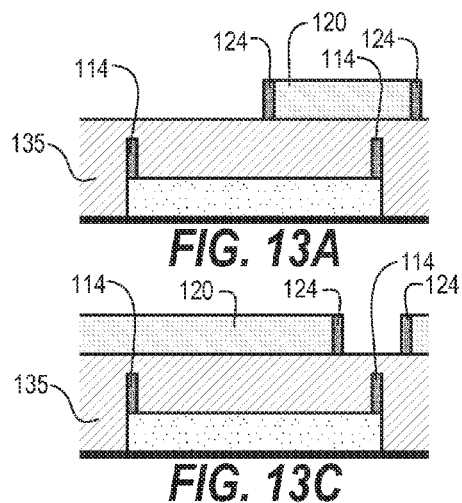
FIG. 13A
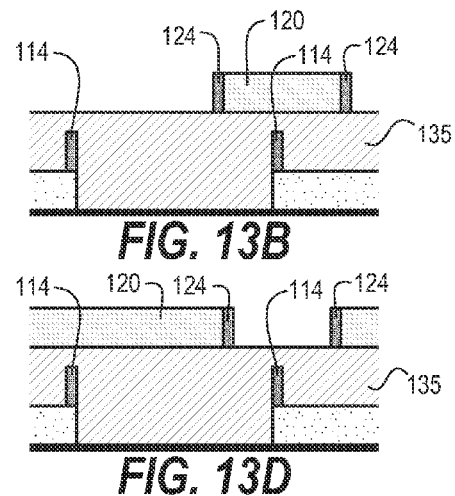
FIG. 13B
FIG. 13C
FIG. 13D
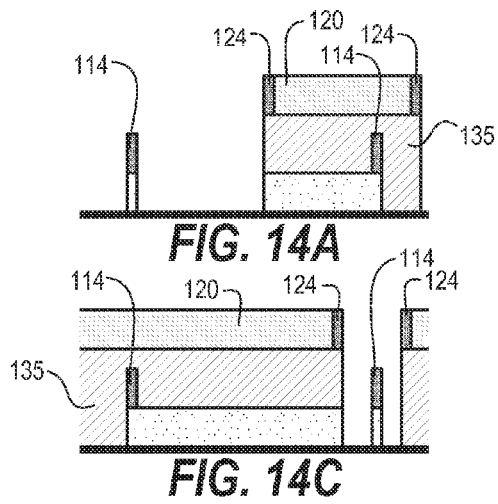
FIG. 14A
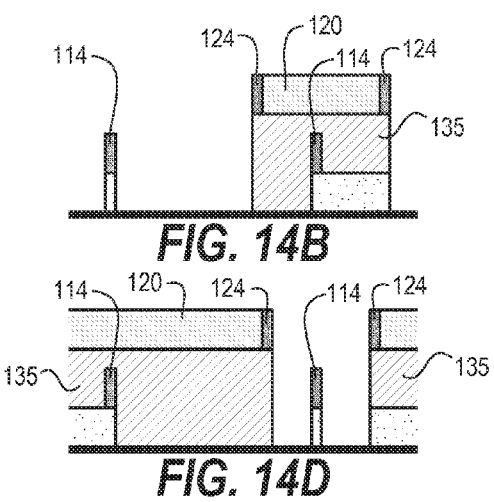
FIG. 14B
FIG. 14C
FIG. 14D
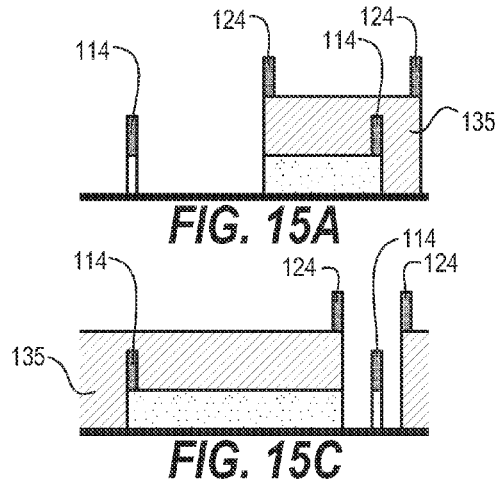
FIG. 15A
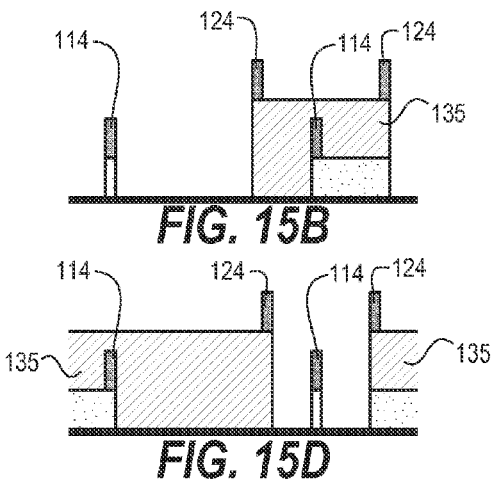
FIG. 15B
FIG. 15C
FIG. 15D

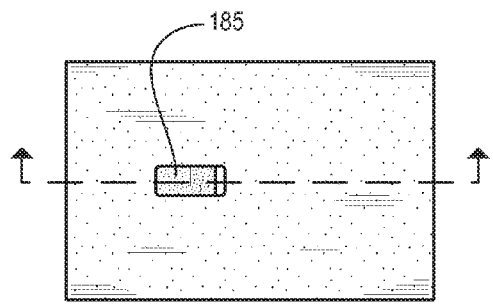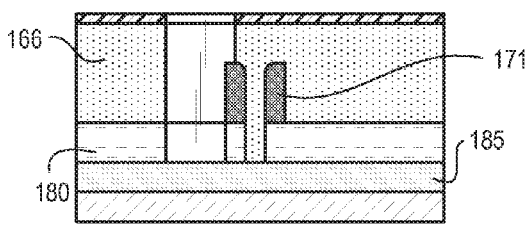
FIG. 33A  FIG. 33B
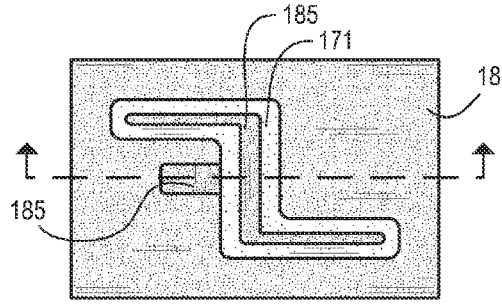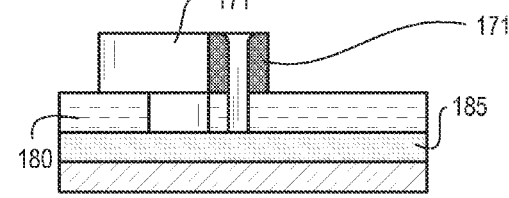
FIG. 34A  FIG. 34B
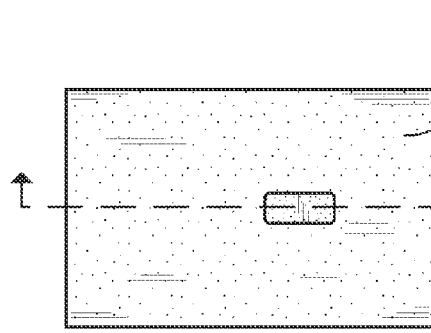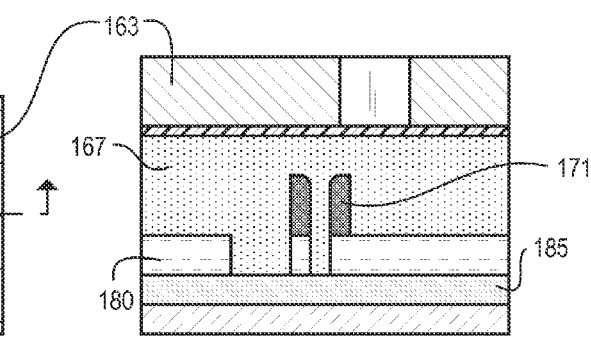
FIG. 35A  FIG. 35B
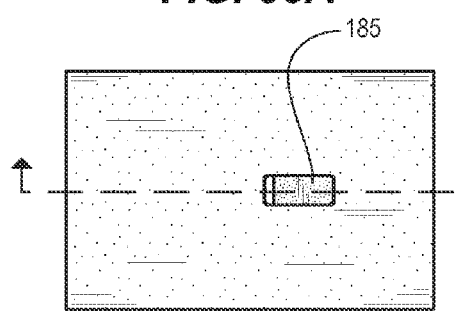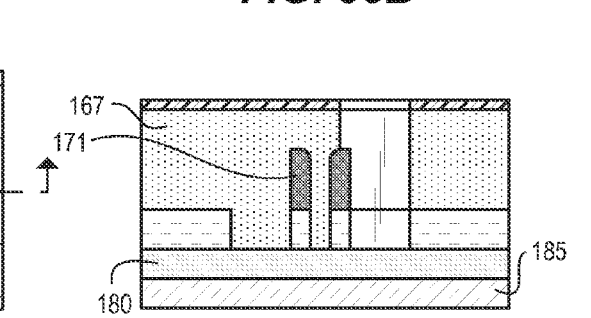
FIG. 36A  FIG. 36B

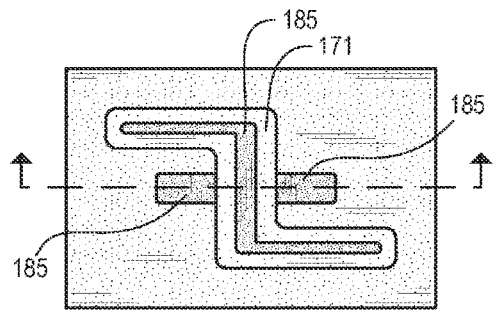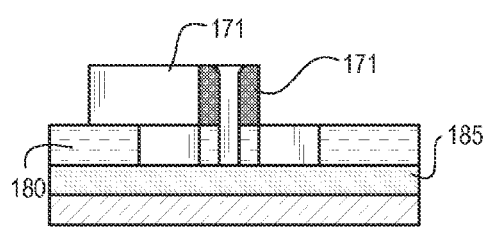
FIG. 37A  FIG. 37B
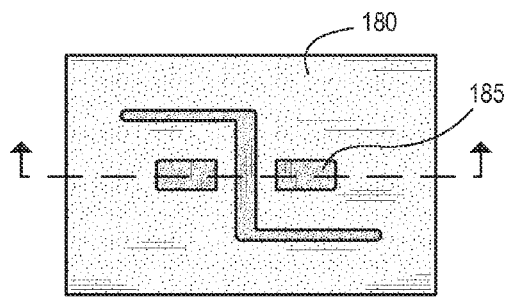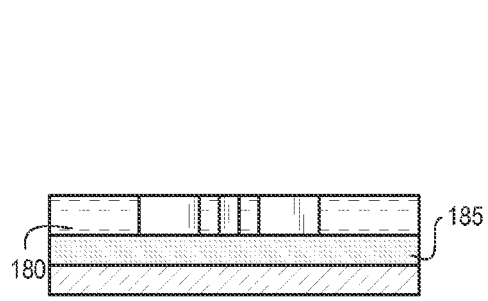
FIG. 38A  FIG. 38B
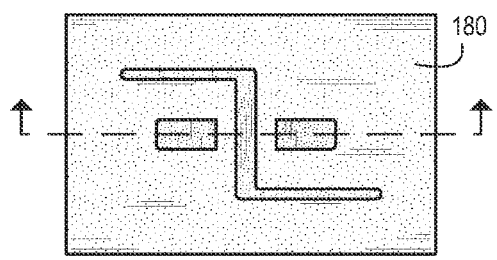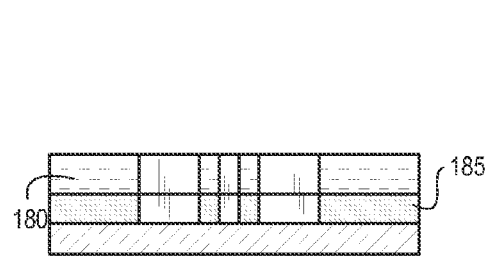
FIG. 39A  FIG. 39B
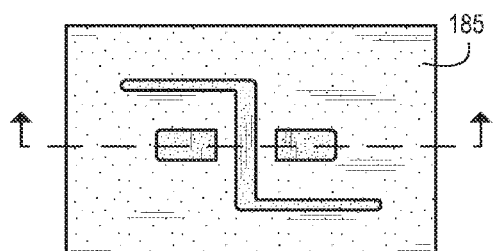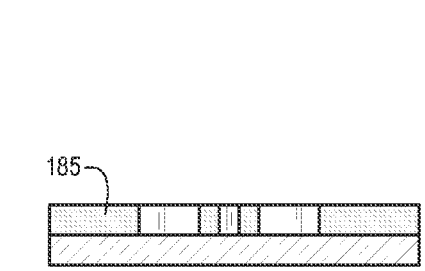
FIG. 40A  FIG. 40B

METHOD OF PATTERNING INCORPORATING OVERLAY ERROR PROTECTION

CROSS REFERENCE TO RELATED APPLICATIONS

The present application claims the benefit of U.S. Provisional Patent Application No. 62/076,476, filed on Nov. 6, 2014, entitled "Method of Patterning Incorporating Overlay Error Protection," which is incorpoated herein by reference in its entirety. The present application also claims the benefit of U.S. Provisional Patent Application No. 62/150,759, filed on Apr. 21, 2015, entitled "Method of Patterning Incorporating Overlay Error Protection," which is incorporated herein by reference in its entirety.

BACKGROUND OF THE INVENTION

This disclosure relates to patterning processes, and, particularly, to patterning processes for microfabrication of electronic devices and components.

In material processing methodologies (such as photolithography), creating patterned layers typically involves the application of a thin layer of radiation-sensitive material, such as photoresist, to an upper surface of a substrate. This radiation-sensitive material is transformed into a relief pattern that can be used as an etch mask to transfer a pattern into one or more underlying layers on the substrate. Patterning of the radiation-sensitive material generally involves exposure by a radiation source through a photomask (and associated optics) onto the radiation-sensitive material using, for example, a photolithography system. This exposure creates a latent pattern within the radiation-sensitive material in that a portion of the material is soluble and a remaining portion is insoluble to a particular developer. The radiation-sensitive material is then developed in that soluble portions are dissolved and removed to yield a relief pattern, which is a topographic or physical pattern. For example, developing can include removal of irradiated regions of the radiation-sensitive material (as in the case of positive photoresist), or non-irradiated regions (as in the case of negative resist) using a corresponding developing solvent. The resulting relief pattern can then function as a mask layer or etch mask.

Various etch techniques can be used for transferring a given pattern into an underlying layer. Semiconductor production equipment commonly uses dry, plasma etch processes to selectively remove material using an etching means. Once a relief pattern is formed on a substrate, the substrate is disposed within a plasma processing chamber and an etching chemistry (typically an ionizable, dissociative gas mixture) feeds a plasma such that products of the plasma selectively etch the underlying layer while minimally etching the mask layer. Microfabrication of electronic devices and components typically involves repeating steps of material deposition, pattern creation, and material removal.

SUMMARY

Success of a given plasma etch process is dependent on using an etch chemistry having chemical reactants suitable for selectively etching one material with respect to another material. Ideally, a plasma etch process functions by etching a first material without etching a second material. Such perfect selectivity is rare though. Plasma etching is still successful if the first material is etched at a substantially greater rate than a rate at which the second material is etched. Depending on material thicknesses and design specifications, an etch rate ratio of (for example) 3:1, 8:1, or 10:1 can be sufficient selectivity to be considered etching one material with respect to the other.

Unfortunately, it is not always possible or practical to achieve perfect etch selectivity between materials. This challenge can be compounded when etching through multiple different layers, some of which can be etched using a same or similar chemistry. One particular etch challenge with microfabrication is that of maintaining accurate overlay between layers, which layers may be stacked one over another. Having accurate overlay (alignment) of an upper layer to a lower layer is beneficial to device performance. Improper overlay—especially with edge placement of component patterns—can create unacceptable defects and shorts. Such overlay challenges can be appreciated knowing that some patterning techniques involve decomposing (separating) a pattern into multiple different masks to be combined on the substrate to create a single, patterned mask or transfer layer. Separating a given pattern into components can be used when a given desired composite pattern has feature sizes below the resolution limits of optical lithography. Accordingly, multiple component masks can be used to create a composite or aggregate pattern. When the component mask patterns overlap, however, patterned features can be merged, destroyed, etc. Thus, overlay challenges can prevent designed patterns from being successfully fabricated.

Techniques herein provide methods for mitigating overlay errors to enable successful etch operations and pattern transfers. One embodiment includes a method for patterning a substrate. A substrate is provided having a first relief pattern positioned on a target layer. The first relief pattern defines one or more openings such that portions of the target layer are elevationally uncovered. First sidewall spacers are formed on vertical surfaces of the first relief pattern. A first combined pattern is transferred into the target layer. The first combined pattern is defined by the first relief pattern and the first sidewall spacers. The first relief pattern is removed such that first sidewall spacers remain. A second relief pattern is formed on the substrate. The second relief pattern defines one or more openings such that portions of the target layer are elevationally uncovered and portions of the first sidewall spacers are elevationally uncovered. A second combined pattern is transferred into the target layer. The second combined pattern being defined by the second relief pattern and the first sidewall spacers. Thus, for transferring secondary or subsequent patterns, a partially-buried sidewall spacer provides overlay protection and prevents joining features where a barrier is specified or desired, and/or provides self-aligned, sub-resolution features.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 1A-8A, FIGS. 1B-8B, FIGS. 1C-8C, and FIGS. 1D-8D are cross-sectional schematic side views of an example substrate segment showing a process flow according to embodiments disclosed herein.

FIGS. 10A-17A, FIGS. 10B-17B, FIGS. 10C-17C, and FIGS. 10D-17D are cross-sectional schematic side views of an example substrate segment showing a process flow according to embodiments disclosed herein.

FIGS. 26A-40A are top views of an example substrate segment showing a process flow according to embodiments disclosed herein.

FIGS. 26B-40B are cross-sectional schematic perspective views of an example substrate segment showing a process flow according to embodiments disclosed herein.

DETAILED DESCRIPTION

Figure 4A:
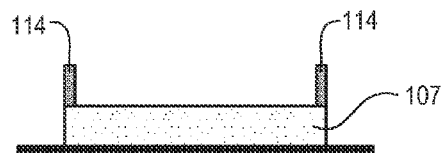
Figure 4B:
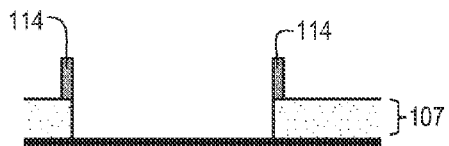
Figure 4C:
Figure 4D:
Figure 5A:
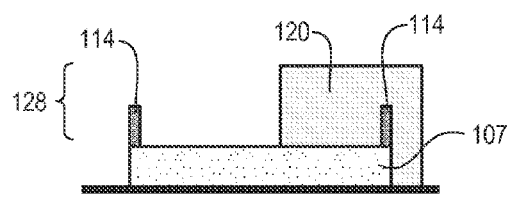
Figure 5B:
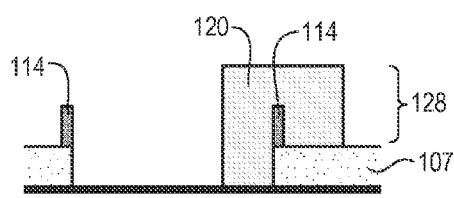
Figure 5C:
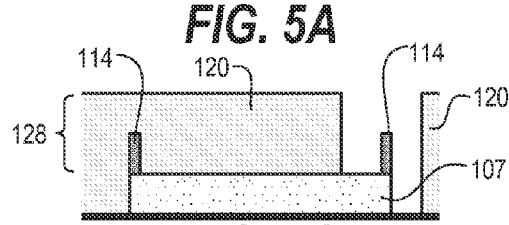
Figure 5D:
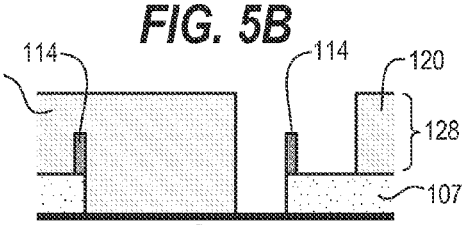
Figure 6A:
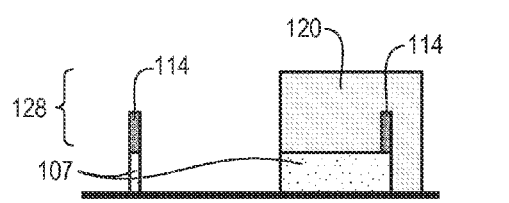
Figure 6B:
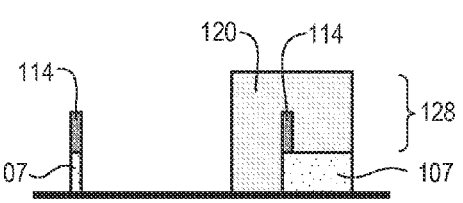
Figure 6C:
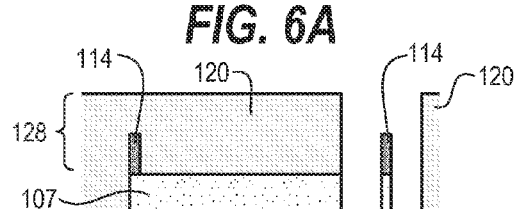
Figure 6D:
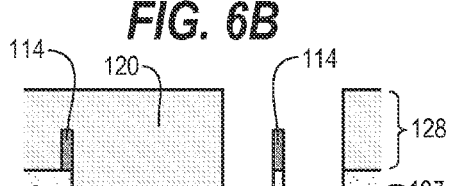
Figure 7A:
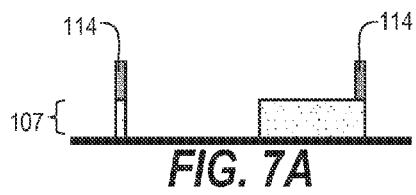
Figure 7B:
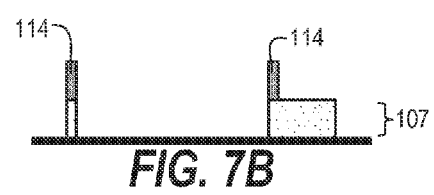
Figure 7C:
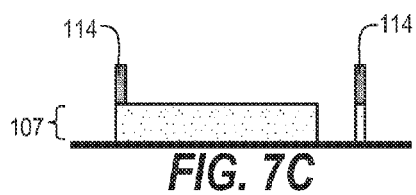
Figure 7D:
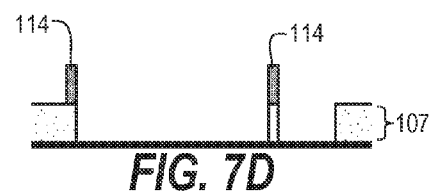
Figure 8A:
Figure 8B:
Figure 8C:
Figure 8D:
Figure 9A:
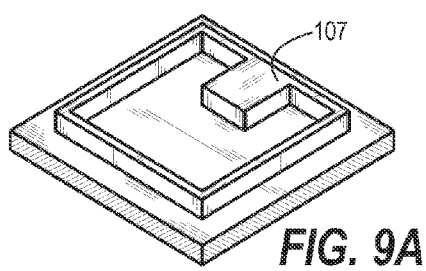
FIG. 9A, FIG. 9B, FIG. 9C, and FIG. 9D are cross-sectional schematic perspective views of an example substrate segment showing patterning results according to embodiments disclosed herein.
Figure 9B:
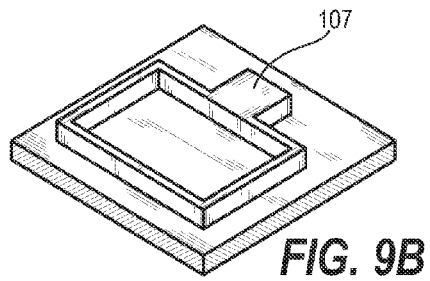
Figure 9C:
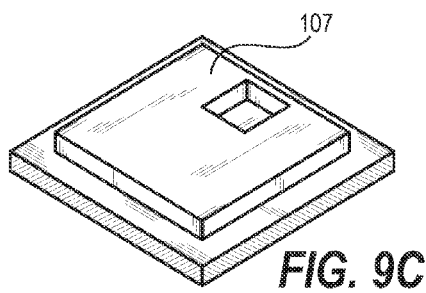
Figure 9D:
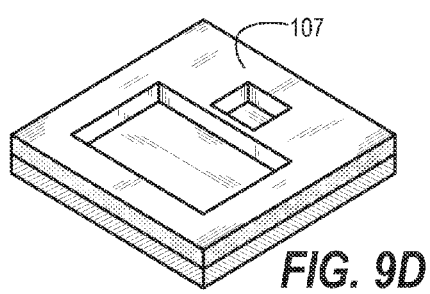
Figure 10A:
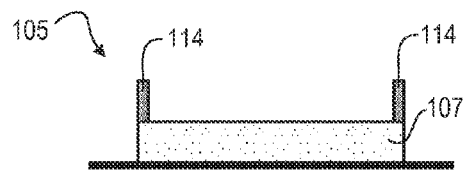
Figure 10B:
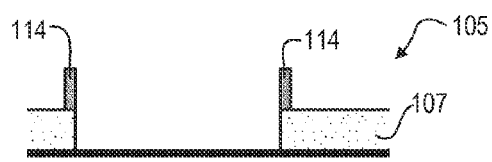
Figure 10C:
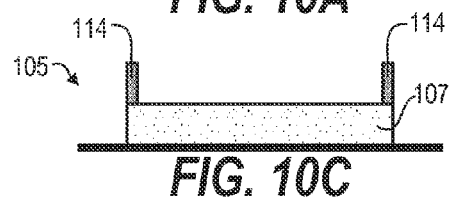
Figure 10D:
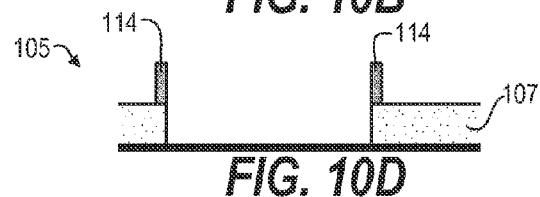
Figure 11A:
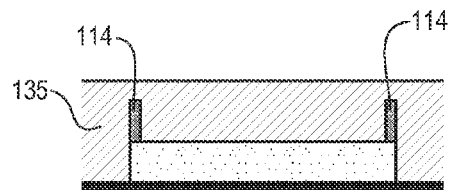
Figure 11B:
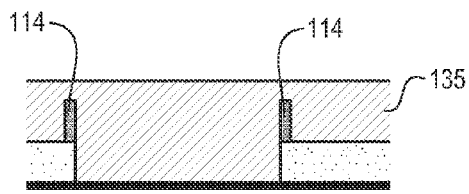
Figure 11C:
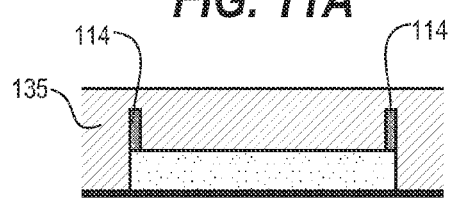
Figure 11D:
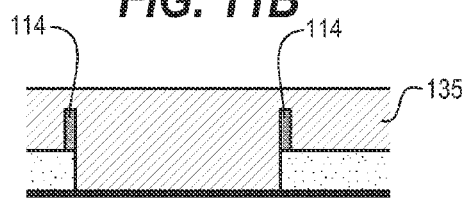
Figure 12A:
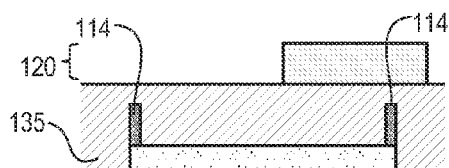
Figure 12B:
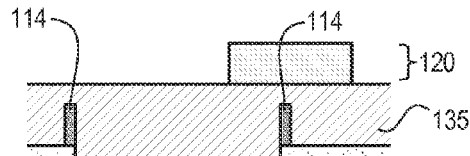
Figure 12C:
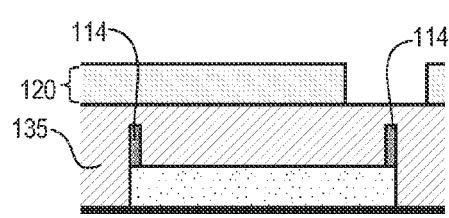
Figure 12D:
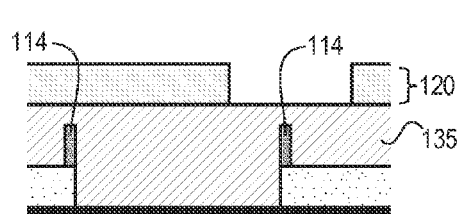
Figure 16A:
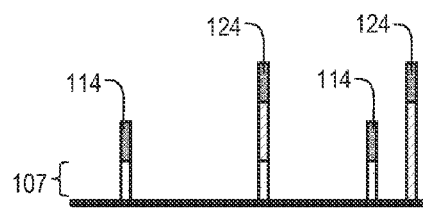
Figure 16B:
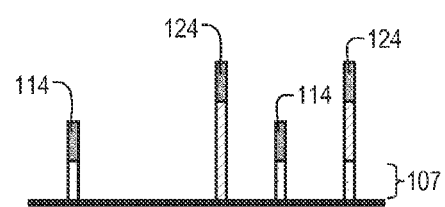
Figure 16C:
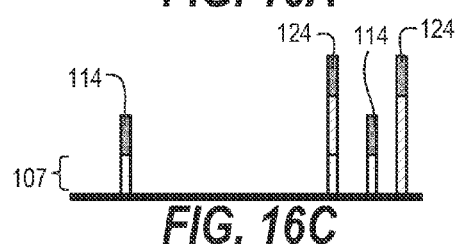
Figure 16D:
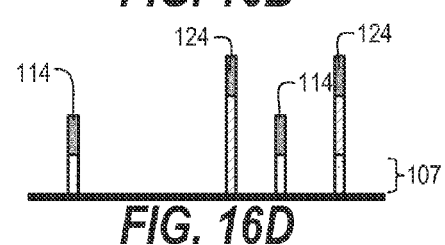
Figure 17A:
Figure 17B:
Figure 17C:
Figure 17D:
Figure 18A:
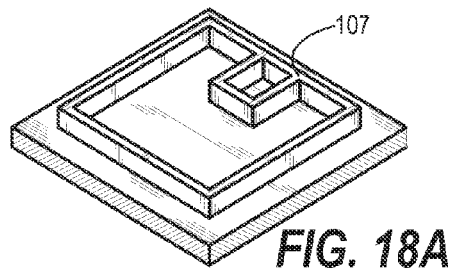
FIG. 18A, FIG. 18B, FIG. 18C, and FIG. 18D are cross-sectional schematic perspective views of an example substrate segment showing patterning results according to embodiments disclosed herein.
Figure 18B:
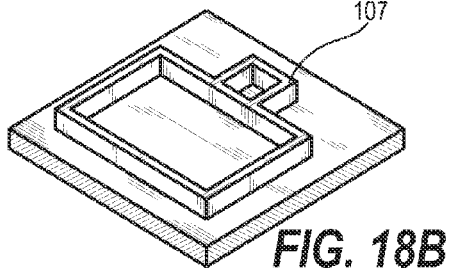
Figure 18C:
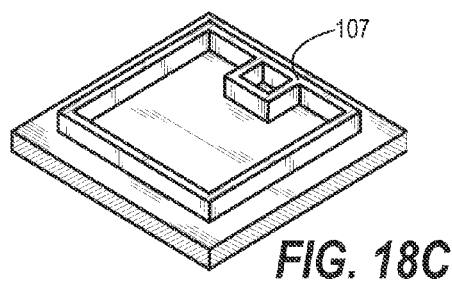
Figure 18D:
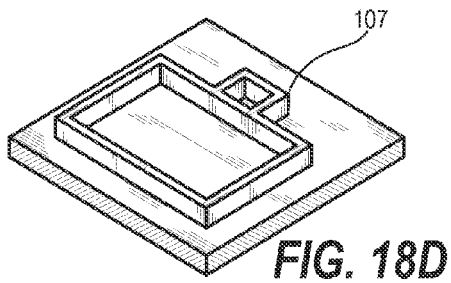

Techniques herein include use of a spacer process (sidewall spacers) with patterning flows during microfabrication for creating hardmasks, structures, features, etc. Techniques herein can be used for metallization, and, in particular, metallization of a first metal layer (conventionally known as M1) above electronic device contacts (such as transistors). Such techniques of using spacers for metallization patterning are outside the conventional use of multiple patterning. More broadly, techniques herein can be used for any type of critical placement where one structure is extremely close to another structure, such as structures designed to be placed between approximately 0.5 to 10 nanometers next to each other. For example, a pattern of contact openings can be accurately created at sub-resolution dimensions.

Techniques herein include using a spacer to define a hard border between features to be patterned. Such a spacer is positioned underneath an overlying relief pattern so that a portion of the spacer is exposed and protecting an underlying layer. Such a technique can reduce the number of component sub-layers or decomposition layers when patterning a given hardmask layer. For example, in some critical patterning applications, three or more lithographic patterning layers (executed sequentially) can be elevationally combined to form a single relief pattern. That is, a single-layer relief pattern that has been created from three separate lithographic exposures, development and transfer operations after being combined together. Such decomposition techniques are conventionally used in part because of the resolution limitations for reliable or accurate lithographic patterning prevent desirable pattern and feature dimensions.

With conventional techniques, merged features or features without a sufficient tolerance between each other can lead to shorts in a given semiconductor device being fabricated. With techniques herein, however, for example, certain lithographic exposure steps can be reduced to two operations or reduced to fewer operations. By using a spacer to define a hard border between critical features, merging of such features can be prevented, and overlay errors are obviated. In other words, despite lithographic patterns having some overlap or misalignment, critical features and barriers can be preserved during etch transfer.

One embodiment includes a method for patterning a substrate. The method comprises providing a substrate having a first relief pattern positioned on a target layer. Being positioned on the target layer can include being directly in contact with the target layer, or indirectly on the target layer with one or more intervening layers in between, which intervening layers can help with planarization, photolithographic exposure (anti-reflection), separate etch selectivities, etc. The first relief pattern can be, for example, a patterned and developed photoresist layer, or a relief pattern of a material other than photoresist. The target layer can be a planar layer of a single material, or can itself be a relief pattern and/or define structures, or can define structures that have been filled and planarized with a planarization material, which planarization material may be sacrificial. For example, the target layer can include an array of lines filled with a filler material for easier deposition and patterning of overlying layers. The first relief pattern need not itself fill spaces between structures of the target layer, but one or more filler materials can fill such spaces and/or provide some overburden or planarization of the target layer. Such a filler material can have a compatible etch selectivity or radiation sensitivity such that this filler material can be removed when desired within a particular process flow.

The target layer may be a final layer, a mask layer, a sacrificial layer, a combination thereof, or otherwise. The target layer can include a layer or structural pattern into which a combined pattern can be transferred. The combined pattern can include a relief pattern and a sidewall spacer. The target layer can include, for example, an array of lines formed by self-aligned double patterning, self-aligned quad patterning, self-aligned multi-patterning, etc. A sacrificial filler material can fill the pattern of structures in the target layer for planarization of the target layer. Structures of the target layer can be at least partially fabricated using one or more relief patterns. Thus, the target layer can define a topography of structures with a sacrificial filler material used to planarize the target layer.

The first relief pattern defines one or more openings such that portions of the target layer are elevationally uncovered. Portions that are elevationally uncovered refer portions that are not directly or indirectly masked by the first relief pattern. For example, material surfaces of the target layer can be directly uncovered/exposed. Alternatively, one or more intermediate layers can be positioned between the first relief pattern and the target layer. Portions of the target layer are elevationally uncovered when defined openings of the first relief pattern are directly above portions of the target layer (or directly accessible by anisotropic etching). In other words, using the first relief pattern as an etch mask, anisotropic etchants can reach the target layer after etching through any intermediate or planarization layers such as an antireflective coating. The first relief pattern itself can be created from two or more component patterns. By way of a non-limiting example, a litho-freeze-litho process can be executed to create the first relief pattern.

FIGS. 1A-1D illustrate an example substrate 105 having a target layer 107 and a first relief pattern 110 disposed thereon. The Figures have different letters to illustrate patterning herein using different relief pattern schemes. For example, first relief pattern 110 of FIGS. 1A and 1C is shown as a mesa or mandrel, while FIGS. 1B and 1D show first relief pattern 110 as defining an opening or hole. As will be described below, Figure numbers with an "A" reference letter use a scheme of a mesa/mandrel for the first relief pattern, and a mesa/mandrel for the second relief pattern. Figure numbers with a "B" reference letter show a first relief pattern defining an opening/hole, and the second relief pattern defining a mesa/mandrel. Figure numbers with a "C" reference letter show a first relief pattern defining a mesa/mandrel, and the second relief pattern defining an opening/hole. Figure numbers with a "D" reference letter show a first relief pattern defining an opening/hole, and the second relief pattern defining an opening/hole. As will be shown, different pattern combinations can yield different results. Note that any relief pattern can be used with any combination of sidewall spacers and underlying target layer.

Referring now to FIGS. 2A-2D, first sidewall spacers 114 are formed on vertical surfaces of the first relief pattern 110. Forming sidewall spacers herein refers to forming spacers on exposed vertical surfaces. Typically, such sidewall spacers are formed by first conformally depositing a particular material (for example, silicon dioxide) on exposed surfaces of a substrate. Then a "spacer open" process step can be executed that includes an anisotropic etch that etches directionally (typically downward) removing spacer material until horizontal surfaces (normal to direction of etchants) are cleared of spacer material, with remaining spacer material left on vertical surfaces, thereby becoming sidewall spacers. Any conventional technique can be used for forming such sidewall spacers.

Various materials can be selected for use as a spacer material. Criteria for selection of a given spacer material can be based on hardness and/or relative etch selectivity. For example, if an initial metal mask component pattern is transferred into spin-on carbon, then silicon dioxide can be used as a spacer material because there is sufficient etch selectivity between silicon dioxide and spin-on carbon. In other patterning schemes the spacer material can be silicon nitride, titanium oxide, etc. Although various deposition techniques can be used, it can be beneficial to deposit material with a high degree of conformality of deposition thickness. Other deposition techniques can include chemical vapor deposition (CVD), plasma assisted-CVD, spin-on deposition, and selective deposition.

A first combined pattern 118 is transferred into the target layer 107. The first combined pattern 118 is defined by the first relief pattern 110 and the first sidewall spacers 114. In other words, the first sidewall spacers 114 and the first relief pattern 110 together define the first combined pattern 118. This transfer operation can be executed using, for example, an anisotropic etch with appropriate selectivity to etch the target layer 107 (and any intermediate layers) without significantly etching the first combined pattern 118. A result of this pattern transfer is shown in FIGS. 3A-3D.

The first relief pattern 110 is removed such that first sidewall spacers 114 remain on substrate 105. An example result of such selective removal is shown in FIGS. 4A-4D.

A second relief pattern 120 is formed on the substrate 105. The second relief pattern 120 defines one or more openings such that portions of the target layer 107 are elevationally uncovered and that portions of the first sidewall spacers 114 are also elevationally uncovered. Second relief pattern 120 can be formed directly on target layer 107 and first sidewall spacers 114 (as shown in FIGS. 5A-5D), or can be formed on an intermediate layer (or layer stack) to assist with pattern creation and/or material deposition. Thus, the substrate 105 can be planarized subsequent to removing the first relief pattern 110 and prior to forming the second relief pattern 120. Optionally, the second relief pattern can be created from two or more component patterns.

A second combined pattern 128 is transferred into the target layer 107. The second combined pattern 128 is defined by the second relief pattern 120 and the first sidewall spacers 114. A result of this pattern transfer is shown in FIGS. 6A-6D. Transferring the second combined pattern 128 can include at least a portion of the first sidewall spacers 114 preventing etching of a region of the target layer 107. Subsequent to transferring the second combined pattern 128 into the target layer 107, a first group of features in the target layer 107 results in a critical dimension being defined by a width of the first sidewall spacers 114, and wherein a second group of features in the target layer have a critical dimension defined by a width of the second relief pattern 120 and a width of the first sidewall spacers 114. Thus, resulting features can include feature dimensions defined by sidewall spacers, and other features defined by a combination of sidewall spacers and relief patterns.

The second relief pattern 120 can be removed from the substrate 105. A result of this removal is shown in FIGS. 7A-7D. First sidewall spacers 114 can also be removed, as shown in FIGS. 8A-8D. FIGS. 9A-9D show different example patterning results using different relief pattern combinations in the corresponding lettered figures. As can be appreciated, any number of structures, mesas, holes, and so forth can be defined while preventing merging of features where relatively thin boundaries separate these features.

Referring now to FIGS. 10-17, an alternative embodiment is shown. FIGS. 10A-10D are similar to FIGS. 4A-4D in which first sidewall spacers 114, formed from a first relief pattern, are positioned on target layer 107. Substrate 105 can then be planarized using a planarizing material 135 as shown in FIGS. 11A-11D. Planarizing material 135 can be deposited by spin-on deposition to provide a planar surface for subsequent photolithographic patterning. Subsequent photolithographic patterning can then be used to create second relief pattern 120, which is entirely positioned on the planarizing material 135 as shown in FIGS. 12A-12D.

Second sidewall spacers 124 are then formed on vertical surfaces of the second relief pattern 120, as shown in FIGS. 13A-13D. Spacer formation can be accomplished by conformal deposition and a spacer open etch. A second combined pattern can then include the second relief pattern, the first sidewall spacers and the second sidewall spacers. This second combined pattern can then be transferred into the target layer as shown in FIGS. 14A-14D. The second relief pattern 120 can then be removed (FIGS. 15A-15D). In some embodiments, the remaining spacer pattern can then be transferred into the target layer 107, as shown in FIGS. 16A-16D, and then planarizing material 135 and first sidewall spacers 114 and second sidewall spacers 124 can be removed, resulting in the pattern shown in FIGS. 17A-17B. FIGS. 18A-18D show different example patterning results using different relief pattern combinations in the corresponding lettered figures. As can be appreciated, any number of structures, mesas, lines, etc., can be defined while preventing merging of features where relatively thin boundaries separate these features. Note that FIGS. 18A-18D, incorporating second or third sidewall spacers can result in a pattern different from that in FIGS. 9A-9D.

In another embodiment, after removing the second relief pattern such that first sidewall spacers and the second sidewall spacers remain on the substrate, a third relief pattern can be formed on the substrate. The third relief pattern defines one or more openings such that portions of the target layer are elevationally uncovered, portions of the first sidewall spacers are elevationally uncovered, and portions of the second sidewall spacers are elevationally uncovered. This third combined pattern can then be transferred into the target layer. This third combined pattern is defined by the third relief pattern, the first sidewall spacers, and the second sidewall spacers. Using such an additional pattern can be useful for defining which areas of a given combined pattern to keep.

Figure 19:
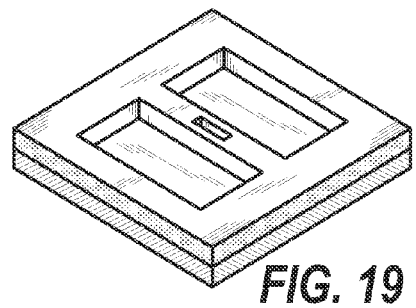
FIG. 19 is a cross-sectional schematic perspective view of an example substrate segment showing patterning results according to embodiments disclosed herein.
Figure 20:
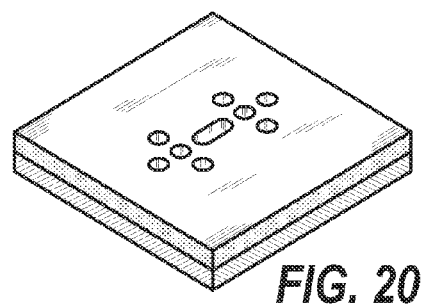
FIG. 20 is a cross-sectional schematic perspective view of an example substrate segment showing patterning results according to embodiments disclosed herein.

FIGS. 19 and 20 are perspective views of example patterns that can be created with patterning techniques herein. FIG. 19 shows a small slot created between two larger openings. FIG. 20 shows a sub-resolution pattern of contact openings.

Figure 21:
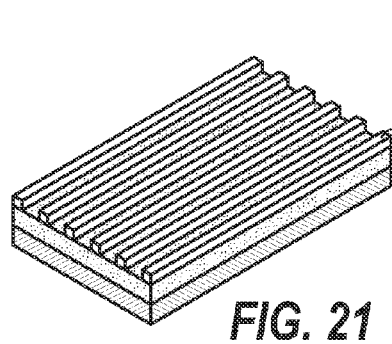
FIGS. 21-24 are cross-sectional schematic perspective views of an example substrate segment showing a process flow according to embodiments disclosed herein.
Figure 22:
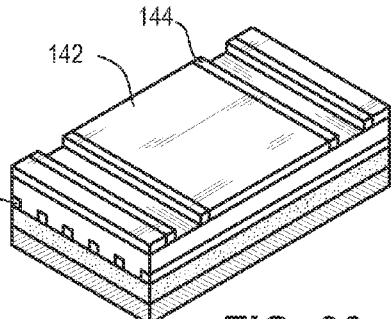
Figure 23:
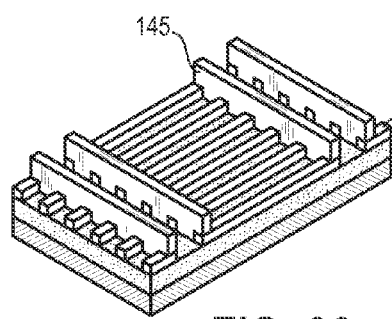
Figure 24:
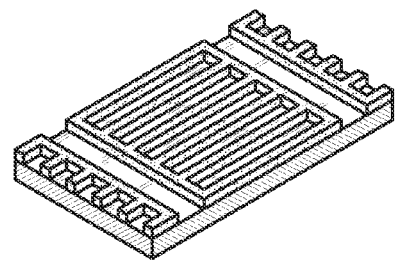

Techniques herein can be used for cutting underlying lines and structures. FIG. 21 shows an array of lines 141, which could be spacers or created from anti-spacers or otherwise. A relief pattern 142 is formed on the substrate after having been planarized with a fill material. Sidewall spacers 144 are formed on vertical sidewalls of the relief pattern 142. The sidewall spacers 144 and the relief pattern 142 are together used as an etch mask to cut the array of lines 141 where elevationally exposed or open to anisotropic etchants. The relief pattern 142 and planarizing material are then removed. The planarizing material can be removed with an etch chemistry that etches the planarizing material with respect to sidewall spacers 144, thereby protecting planarizing material underneath sidewall spacers 144. What is left is the array of lines 141—having been cut—and structures 145 created from sidewall spacers 144, as shown in FIG. 23. This combined pattern can then be used as an etch mask to transfer this pattern into an underlying layer, with an example result shown in FIG. 24.

Figure 25:
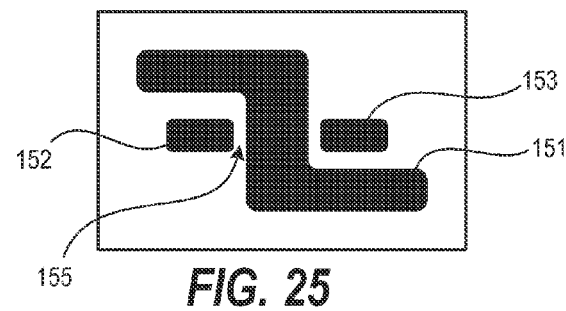
FIG. 25 is a top view of an example pattern for fabrication.

Referring now to FIGS. 25-40, a non-limiting example embodiment and application is shown for back-end metallization of a metal one (M1) layer for a given node. For smaller nodes, it is common or necessary to use 2-D deconstructions. For convenience in explaining embodiments herein, a metal one layer having a three layer decomposition will be used. In this example, three different lithographic patterns are used to form a combined pattern. These include component 151, component 152, and component 153 as shown in FIG. 25, which is a top view of a given composite pattern. Note that each component can be a pattern in separate photomasks.

Note that this group of lithographic patterns, when combined, defines features having relatively close tolerances, as shown at location 155 identifying a relatively short tip-to-line separation between component 151 and component 152. For example, a given slot (such as in component 152) being patterned may be generally rectangular shaped having a given length and width. This given slot to be patterned may have a placement on a substrate in which an end of this slot shape is separated from an adjacent slot or trench by a distance approximately equal to a width of the slot (or other specified distance). In other examples, a given pair of features to be defined has a horizontal placement separation of only single nanometers or less, or of just tens of nanometers. One challenge with such decomposition or aggregate patterning is that lithographic overlay misalignment can routinely exceed such desired horizontal placement separation. By way of a non-limiting example for node 10 of semiconductor industry fabrication, placement separation between a given pair of features can be approximately 10 to 15 nm, which is well within possible overlay and/or misalignment errors.

Techniques herein provide a method to ensure proper placement of metallization features without causing shorting. In embodiments herein, a first component of a given metallization layer is formed, and then a spacer is formed around defined features (holes, slots, trenches), which spacer will function as a hard border for subsequent metallization layer patterning components.

Figure 26A:
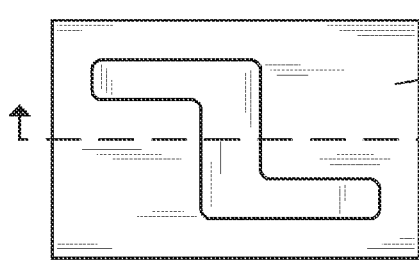
Figure 26B:
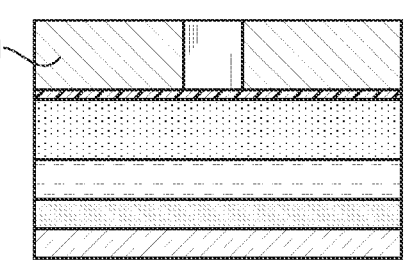

In one example embodiment, component 151 of a first metallization layer is lithographically exposed and developed. FIG. 26A shows a top view of a relief pattern 161 defining component 151, while FIG. 26B shows a side cross-sectional view with relief pattern 161 positioned on multiple underlying layers. Relief pattern 161 can be, for example, a photoresist material. Note that FIGS. 26A-40A show top views of a substrate segment being processed, and that FIGS. 26B-40B show a corresponding cross-sectional side views of the substrate segment.

Figure 27A:
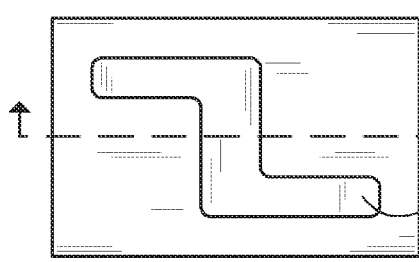
Figure 27B:
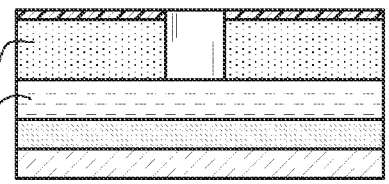
Figure 28A:
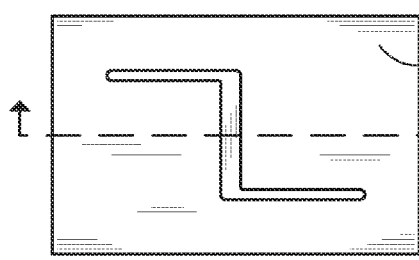
Figure 28B:
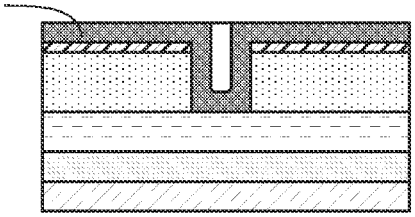

Relief pattern 161 is transferred into one or more underlying layers, and then relief pattern 161 can be removed. FIGS. 27A and 27B show layer 165 now defining a pattern received from relief pattern 161, with target layer 180 now exposed. As such, layer 165 has become a relief pattern itself. As will be seen, target layer 180 can function as a memorization layer to accumulate multiple different patterns for subsequent simultaneous transfer.

Next, a conformal layer 170 is deposited on the substrate, to be made into sidewall spacers. An example conformal material can include silicon dioxide. Because this spacer material can wrap around given defined openings, this spacer deposition can be described as a collar spacer. The conformal layer has essentially a same thickness on all surfaces receiving the deposition.

Figure 29A:
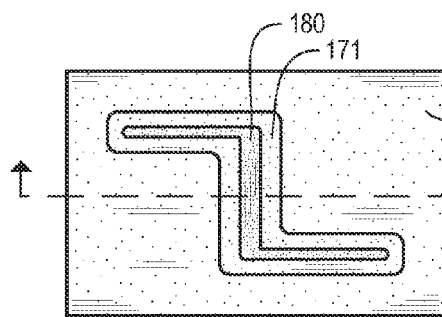
Figure 29B:
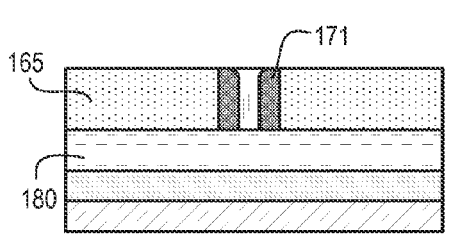

After depositing conformal layer 170, a spacer open process is executed. In a spacer open process, or opening spacer step, an etch process can be used to remove spacer/conformal material from horizontal surfaces on the substrate. Such a spacer open process can be accomplished by executing an anisotropic etch process that removes spacer material from horizontal surfaces including horizontal surfaces of a given top layer as well as horizontal surfaces of an underlying layer or target layer having received conformal spacer material. This leaves the conformal spacer material on sidewalls or vertical surfaces as sidewall spacers 171 of the composition layer as shown in FIGS. 29A and 29B. Such a composition layer can include layer 165 and sidewall spacers 171.

Figure 30A:
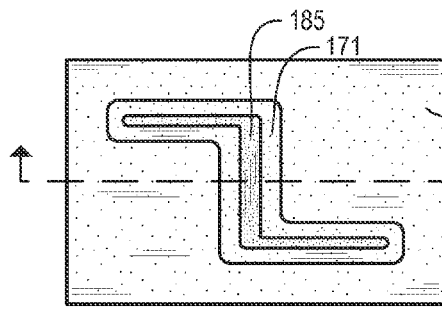
Figure 30B:
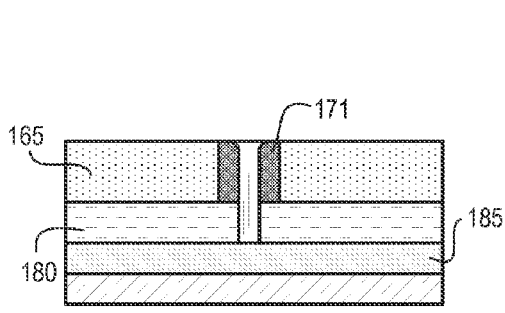

The collar spacer essentially forms a border around the inside of a feature including features that may eventually be filled with copper or other metal. After this collar spacer has been formed, an etch step can be executed that transfers the pattern from a composition of sidewall spacers 171 and layer 165 into target layer 180 underlying the composition layer. By way of a non-limiting example, this target layer 180 can be selected as silicon nitride. Thus both the vertical collar spacer as well as surrounding material on the composition layer function as an etch mask so that a pattern that is transferred to the target layer 180 is a pattern defined by both layer 165 and the collar spacer. FIGS. 30A and 30B illustrates this pattern transfer result. Note that hard mask layer 185 is now partially exposed.

Figure 31A:
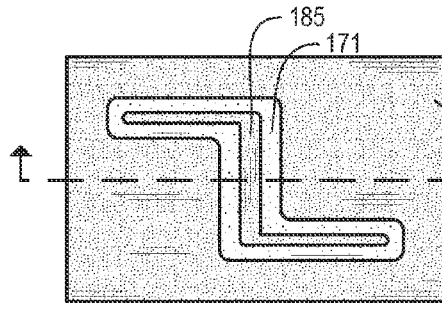
Figure 31B:
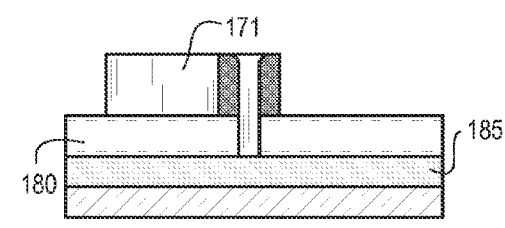

After this pattern transfer into target layer 180, layer 165 can be removed from the substrate leaving the collar spacer as a free standing structure, as shown in FIGS. 31A and 31B. One benefit of this technique is using a spacer to define an image for pattern transfer, but not necessarily in the composition layer surrounding the spacer, as will be apparent through this description.

Subsequent lithographic patterning can benefit from this collar spacer that remains on the substrate. A given subsequent patterning component of a particular opening (contact, trench, etc.) can even be designed to come in contact elevationally with the collar spacer (crossing from a top-down view perspective). As one or more additional cuts or openings are patterned and developed, the collar spacer will provide a hard boundary that will always provide a predetermined degree of separation between various features being patterned for a given metallization layer or other layer, that is, adjacent metallization features. This collar spacer then provides a minimum distance between adjacent metallization structures that can eventually be filled with metal in some example embodiments.

This minimum distance can be defined by a thickness of a particular collar spacer, which is a thickness of a particular conformally deposited material used to create the spacer. For example, if a given conformally deposited material was deposited at a thickness of 6 nm, then an approximate thickness of 6 nm would be on both horizontal and vertical surfaces prior to spacer opening. After spacer opening (removal of conformal material from horizontal surfaces) conformally deposited material remains on vertical surfaces at about the given initial thickness of 6 nm. Note that this thickness is used for illustration purposes only, and any desired thickness of this material can be deposited using conventionally known deposition techniques such as atomic layer deposition and chemical vapor deposition among others. In other embodiments, a collar spacer around 0.5 nm can be created, which can then provide a minimum 0.5 nm of spacer material between adjacent metal features. As such, this spacer definition technique can be used to provide a minimum spacing around adjacent structures to be patterned, especially for metallization techniques. In other words, edge placement is established by using a spacer process, which guarantees a minimum placement separation. Such techniques as described herein are beneficial because overlay enhancement packages for lithography tools can have a significant cost per scanner cell. Other conventional approaches to correct overlay error involve using significant numbers of engineers and analysts to extract data from the wafers, analyze, and try to optimize various fabrication processes. Even with such substantial resources, resulting overlay tolerance or error is often about 5 nm in a best case. Techniques herein forgo using such wafer analysis techniques and lithographic tool overlay correction packages, and instead builds overlay error protection directly into the materials and fabrication process itself, thereby obviating conventional error correction techniques.

One benefit of techniques herein is that building such a spacer-based overlay protection guarantees a minimum spacing between adjacent structures regardless of lithographic overlay misalignment (unintentional misalignment or intentional misalignment). Minimum spacing then becomes dependent on a given a predetermined thickness of a spacer deposition.

Figure 32A:
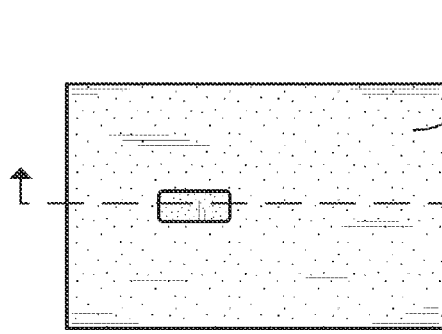
Figure 32B:
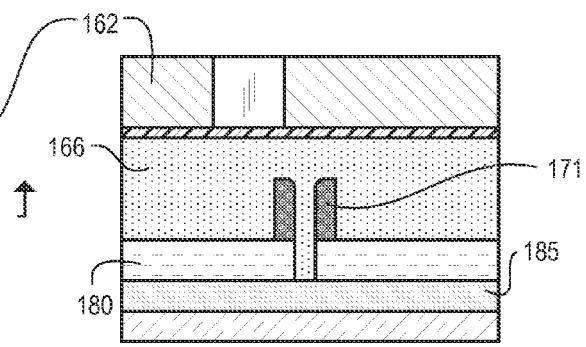

Continuing with patterning techniques in this example, a layer 166 can then be deposited on the substrate, which can be a planarizing layer. For example, more spin-on carbon can be deposited which fills in defined features (transferred openings in the target layer) and covers the collar spacer. Spin-on carbon additionally provides the planarization surface for a subsequent lithographic mask exposure process. Note that with lithographic patterning steps any conventional track-based or etch-based slimming techniques can be used for defining a desired opening or feature. FIGS. 32A and 32B show layer 165 filling openings in target layer 180, burying sidewall spacers 171, and providing a planar surface for relief pattern 162, which corresponds to component 152 of FIG. 25.

The pattern from relief pattern 162 is transferred into layer 166 and into target layer 180. Etch chemistries can be changed from one layer to another if needed. Relief pattern 162 can then be removed. A result is shown in FIGS. 33A and 33B. Note that in this example relief pattern 162 has an opening that is partially over sidewall spacers 171 (the collar spacer) to illustrate overlay misalignment. Although there is overlay misalignment, the collar spacer buried within layer 166 provided an etch barrier so that the misaligned slot did not transfer the misaligned portion into target layer 180. As can be seen, portions of target layer 180 that are directly underneath the collar spacer were protected from directional etchants. Thus, the collar spacer prevents overlay errors as the spacer defines a hard edge. Layer 166 and any antireflective or other planarizing films can then be removed, resulting in the substrate segment shown in FIGS. 34A and 34B.

The process flow shown and described in FIGS. 32A and 32B to FIGS. 34A and 34B is repeated in FIGS. 35A and 35B to FIGS. 37A and 37B. Once again, the collar spacer is buried, this time in layer 167 which provides a planar surface for creating relief pattern 163 corresponding to component 153 of FIG. 25. Overlay misalignment is visible in FIGS. 36A and 36B, but the buried sidewall spacers 171 provides a hard border or etch resistant mask to protect underlying dimensions to be kept. Layer 167 can then be removed. For this particular example pattern, a composite pattern has been created within target layer 180, and thus sidewall spacers 171 can be removed, as shown in FIGS. 38A and 38B.

This composite pattern can then be used for continued fabrication, such as by transferring the composite pattern into hard mask layer 185, as shown in FIGS. 39A and 39B. FIGS. 40A and 40B show the substrate segment with target layer 180 having been removed. The resulting hard mask pattern has sub-resolution barriers preserved for additional fabrication or patterning processes. For more efficient patterning, features of composite patterns can be combined, with strategically placed sidewall spacers protecting barriers. For example, components 152 and 153 can be extended towards each other and merged into a single shape which spans component 151. The buried spacer will then protect desired barriers from being consumed in etch processes, with two patterns transferred at one time. Overlapping into component 151 is acceptable as this area is to be removed anyway. Thus techniques herein provide opportunities for reducing a number of compositions used.

Other embodiments for patterning a substrate include providing a substrate having a composition layer positioned on a target layer. The composition layer includes a first relief pattern defining one or more openings such that portions of the target layer are elevationally uncovered. This first relief pattern can, for example, define feature components of a composition pattern. A spacer material is conformally deposited on the substrate such that the spacer material is deposited on exposed surfaces of the composition layer and underlying layer. The underlying layer can be the target layer itself, or any intermediate layer or film that might help with fabrication.

A spacer-open process is executed that removes spacer material from horizontal surfaces of the composition layer and the underlying layer, such that spacer material remains on vertical surfaces of the first relief pattern. A first combined pattern defined by the first relief pattern and the spacer material is transferred into the target layer. The first relief pattern is removed such that spacers remain positioned over the target layer.

A planarizing film is deposited on the substrate that provides a planar surface includes filling openings in the target layer and burying spacers within the planarizing film. A second relief pattern is created in the planarizing film. The second relief pattern defines one or more openings such that portions of the target layer are elevationally uncovered. A second combined pattern defined by the second relief pattern and the spacers is transferred into the target layer. Thus a pattern can be transferred with overlay error protection.

Other embodiments can include removing the second relief pattern and the spacers from the substrate. The target layer now defines a third relief pattern. The third relief pattern being a combination of the first relief pattern and the second relief pattern. Steps of creating an additional relief pattern, transferring the additional relief pattern into target layer, and removing the additional relief pattern can be repeated as desired.

In yet another embodiment, a collar spacer of conformal material is formed on a first relief pattern, with a resulting collar spacer being a sidewall spacer. A first combined pattern is transferred into a target layer underlying the relief pattern and collar spacer. The first combined pattern includes the first relief pattern and the collar spacer. The first relief pattern is removed such that the collar spacer remains. A planarization layer is deposited on the substrate. A second relief pattern is formed on the planarization layer. A second combined pattern is transferred into the target layer. The second combined pattern includes the second relief pattern and the collar spacer. The collar spacer prevents pattern transfer in the target layer at specific locations. Transferring the first combined pattern into the target layer includes using an etch chemistry that selectively etches target layer material and relief pattern material at least five times faster than an etch rate of collar spacer material.

Thus, such embodiments provide methods for mitigating overlay errors to enable successful etch operations and pattern transfers.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
   providing a substrate having a first relief pattern positioned on a target layer, the first relief pattern defining one or more openings such that portions of the target layer are elevationally uncovered, the first relief pattern being created from two or more component patterns formed in-plane with each other;
   forming first sidewall spacers on vertical surfaces of the first relief pattern;
   transferring a first combined pattern into the target layer, the first combined pattern defined by the first relief pattern and the first sidewall spacers;
   removing the first relief pattern such that first sidewall spacers remain;
   forming a second relief pattern on the substrate, the second relief pattern defining one or more openings such that portions of the target layer are elevationally uncovered and portions of the first sidewall spacers are elevationally uncovered; and
   transferring a second combined pattern into the target layer, the second combined pattern defined by the second relief pattern and the first sidewall spacers, wherein the target layer defines a pattern of structures prior to providing the first relief pattern on the substrate and prior to forming the first sidewall spacers.

2. The method of claim 1, further comprising:
planarizing the substrate subsequent to removing the first relief pattern and prior to forming the second relief pattern.

3. The method of claim 1, wherein a sacrificial filler material fills the pattern of structures in the target layer for planarization of the target layer.

4. The method of claim 3, wherein structures of the target layer are at least partially fabricated using one or more relief patterns.

5. The method of claim 1, wherein the second relief pattern was created from two or more component patterns formed in-plane with each other.

6. The method of claim 1, wherein transferring the second combined pattern includes at least a portion of the first sidewall spacers preventing etching of a region of the target layer.

7. The method of claim 1, wherein subsequent to transferring the second combined pattern into the target layer, a first group of features in the target layer result in a critical dimension defined by a width of the first sidewall spacer, and wherein a second group of features in the target layer have a critical dimension defined by a width of the second relief pattern and a width of the first sidewall spacer.

8. The method of claim 1, further comprising:
forming second sidewall spacers on vertical surfaces of the second relief pattern; and
wherein transferring the second combined pattern into the target layer includes the second combined pattern defined by the second relief pattern, the first sidewall spacers, and the second sidewall spacers.

9. The method of claim 8, wherein the target layer defines a topography of structures with a sacrificial filler material planarizing the target layer prior to providing the first relief pattern on the substrate and prior to forming the first sidewall spacers.

10. The method of claim 8, further comprising:
removing the second relief pattern such that first sidewall spacers and the second sidewall spacers remain on the substrate;
forming a third relief pattern on the substrate, the third relief pattern defining one or more openings such that portions of the target layer are elevationally uncovered, portions of the first sidewall spacers are elevationally uncovered, and portions of the second sidewall spacers are elevationally uncovered; and
transferring a third combined pattern into the target layer, the third combined pattern defined by the third relief pattern, the first sidewall spacers, and the second sidewall spacers.

11. A method for patterning a substrate, the method comprising:
providing a substrate having a composition layer positioned on a target layer, the composition layer including a first relief pattern defining one or more openings such that portions of the target layer are elevationally uncovered;
conformally depositing a spacer material on the substrate such that the spacer material is deposited on exposed surfaces of the composition layer and underlying layer;
executing a spacer-open process that removes spacer material from horizontal surfaces of the composition layer and the underlying layer, such that spacer material remains on vertical surfaces of the first relief pattern as first sidewall spacers;
transferring a first combined pattern defined by the first relief pattern and the first sidewall spacers into the target layer;
removing the first relief pattern such that the first sidewall spacers remain positioned over the target layer;
depositing a planarizing film on the substrate that provides a planar surface and that fills openings in the target layer and buries first sidewall spacers within the planarizing film;
creating a second relief pattern on the planarizing film, the second relief pattern defining one or more openings such that portions of the target layer are elevationally uncovered;
forming second sidewall spacers on vertical surfaces of the second relief pattern; and
transferring a second combined pattern into the target layer, the second combined pattern defined by the second relief pattern, the first sidewall spacers, and the second sidewall spacers.

12. The method of claim 11, wherein the first relief pattern was created from two or more component patterns formed in-plane with each other; and
wherein the target layer defines a pattern of structures prior to providing the first relief pattern on the substrate and prior to forming the first sidewall spacers.

13. The method of claim 11, further comprising:
removing the second relief pattern and the first sidewall spacers from the substrate, the target layer now defining a third relief pattern, the third relief pattern being a combination of the first relief pattern and the second relief pattern.

14. The method of claim 13, further comprising repeating steps of creating an additional relief pattern, transferring the additional relief pattern into the target layer, and removing the additional relief pattern.

15. The method of claim 11, wherein the first relief pattern defines feature components of a composition pattern.

16. A method for patterning a substrate, the method comprising:
providing a substrate having a first relief pattern positioned on a target layer, the first relief pattern defining one or more openings such that portions of the target layer are elevationally uncovered, the target layer defining a topography of structures prior to the first relief pattern being formed on the target layer;
forming a collar spacer of conformal material on the first relief pattern, a resulting collar spacer being a first sidewall spacer;
transferring a first combined pattern into the target layer underlying the first relief pattern and collar spacer, the first combined pattern including the first relief pattern and the collar spacer;
removing the first relief pattern such that the collar spacer remains;
depositing a planarization layer on the substrate;
forming a second relief pattern on the planarization layer, and
transferring a second combined pattern into the target layer, the second combined pattern including the second relief pattern and the collar spacer, the collar spacer preventing pattern transfer into the target layer at specific locations.

17. The method of claim 16, wherein transferring the first combined pattern into the target layer includes using an etch chemistry that selectively etches target layer material and relief pattern material at least five times faster than an etch rate of collar spacer material.

18. The method of claim 16, further comprising:
forming second sidewall spacers on vertical surfaces of the second relief pattern;
wherein transferring the second combined pattern into the target layer includes the second combined pattern defined by the second relief pattern, the first sidewall spacers, and the second sidewall spacers;
removing the second relief pattern such that first sidewall spacers and the second sidewall spacers remain on the substrate;
forming a third relief pattern on the substrate, the third relief pattern defining one or more openings such that portions of the target layer are elevationally uncovered, portions of the first sidewall spacers are elevationally uncovered, and portions of the second sidewall spacers are elevationally uncovered; and
transferring a third combined pattern into the target layer, the third combined pattern defined by the third relief pattern, the first sidewall spacers, and the second sidewall spacers.

* * * * *